(12) United States Patent
Uchida

(10) Patent No.: US 6,831,311 B2
(45) Date of Patent: Dec. 14, 2004

(54) SOLID-STATE IMAGING DEVICE

(75) Inventor: Shinji Uchida, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 102 days.

(21) Appl. No.: 10/436,080

(22) Filed: May 13, 2003

(65) Prior Publication Data
US 2003/0197210 A1 Oct. 23, 2003

Related U.S. Application Data

(63) Continuation of application No. 09/544,900, filed on Apr. 7, 2000, now Pat. No. 6,583,438.

(30) Foreign Application Priority Data

Apr. 12, 1999 (JP) .............................. 11-104367

(51) Int. Cl.[7] .............................................. H01L 29/062
(52) U.S. Cl. ....................... 257/290; 257/291; 257/292; 257/294; 257/432; 257/436; 257/59; 359/619; 359/620; 359/621; 359/622
(58) Field of Search .......................... 257/59, 290, 291, 257/292, 294, 432, 436; 359/619, 620, 621, 622

(56) References Cited

U.S. PATENT DOCUMENTS

| 5,239,412 A | * | 8/1993 | Naka et al. ................. 359/619 |
| 5,479,049 A | * | 12/1995 | Aoki et al. ................. 257/642 |
| 5,593,913 A | | 1/1997 | Aoki |
| 5,604,635 A | | 2/1997 | Lawandy |
| 5,670,384 A | | 9/1997 | Needham |
| 6,040,591 A | * | 3/2000 | Otsuka ........................ 257/232 |
| 6,171,883 B1 | | 1/2001 | Fan et al. |
| 6,188,094 B1 | * | 2/2001 | Kochi et al. ................. 257/232 |
| 6,330,112 B1 | | 12/2001 | Kaise et al. |
| 6,362,498 B2 | * | 3/2002 | Abramovich ................ 257/233 |
| 6,414,343 B1 | * | 7/2002 | Kondo et al. ................ 257/294 |
| 2001/0033007 A1 | | 10/2001 | Lee |
| 2003/0173599 A1 | * | 9/2003 | Nakai ......................... 257/225 |

FOREIGN PATENT DOCUMENTS

| EP | 0 843 362 A1 | | 5/1998 |
| JP | 61-49466 | * | 3/1986 |
| JP | 4-223371 | * | 12/1990 |
| JP | 3-190169 | * | 8/1991 |
| JP | 4-275459 | | 4/1992 |
| JP | 4-223371 | | 8/1992 |
| JP | 4-275459 | | 10/1992 |
| JP | 5-41506 | | 2/1993 |
| JP | 6-232379 | | 8/1994 |
| JP | 7-22599 | | 1/1995 |
| JP | 9-159805 | | 6/1997 |
| JP | 10-22487 | * | 1/1998 |
| JP | 10-206605 | | 8/1998 |

OTHER PUBLICATIONS

Patent Abstracts of Japan for Jap. Publ. No. 10229180. published Aug. 25, 1998.
Copy of European Search Report dated May 2, 2002. for EP 00 10 7776.

* cited by examiner

Primary Examiner—Nathan J. Flynn
Assistant Examiner—Ahmed N. Sefer
(74) Attorney, Agent, or Firm—Smith, Gambrell & Russell, LLP

(57) ABSTRACT

A conventional solid-state imaging device in which a sealing resin is applied onto a microlens has a low condensing efficiency. There are provided a photodiode 14 for receiving light, a microlens 4 made of a resin set on the photodiode 14 and having a refractive index of n3, a thin-film lens 3 formed on the microlens 4 and having a refractive index of n2, a sealing resin 2 formed on the thin-film lens 3 and having a refractive index of n1, and cover glass 1 formed on the sealing resin 2 to seal the sealing resin 2. The refractive index n2 of the thin-film lens 3 is set to a value smaller than n1 and n3. In this case, it is assumed that values of n1 and n3 are substantially equal to each other and the thin-film lens 3 is made of fluoride and/or oxide.

11 Claims, 4 Drawing Sheets

SOLID-STATE IMAGING DEVICE

The present application is a continuation of Ser. No. 09/544,900, filed Apr. 7, 2000 now U.S. Pat. No. 6,583,438 and which is incorporated herein in its entirety by reference.

BACKGROUND OF THE INVENTION

1. Field of the Invention

The present invention relates to a solid-state imaging device having a microlens and sealing resin on the microlens.

2. Description of the Prior Art

As for a solid-state imaging device using a CCD (Charge Coupled Device), the area of a photodiode serving as a light-receiving portion has been decreased because of requests for decrease in size and improvement in resolution. To compensate the deterioration of a condensing efficiency due to decrease of the area of the light-receiving portion, the so-called microlens has been developed and used.

The microlens is normally made of resin and set above a light-receiving portion formed for each pixel to directly refract light not incoming to the light-receiving portion, to condense the light in the light-receiving portion, and to improve the condensing efficiency and the sensitivity.

However, because the microlens is weak in humidity, it is necessary to protect the microlens by any means when the lens is used under a severe condition such as high temperature and high humidity. For example, the official gazette of Japanese Patent Laid-Open No. 5-41506 discloses a structure in which a microlens is covered with resin and moreover, cover glass for sealing the resin is used.

However, at the time of selecting a sealing resin for covering a microlens by considering heat resistance, transparency, spectral performance, and refractive-index change, it is unavoidable to select a resin almost the same as the material of the microlens and thereby, the refractive index of the sealing resin becomes almost equal to that of the microlens. As a result, problems occur that the condensing effect of the microlens deteriorates and the light reaching the microlens cannot be completely condensed on a photodiode.

Though an action for increasing a refractive index of a microlens or improving a condensing effect by decreasing a refractive index oaf sealing resin is taken, it is impossible to solve the problems such as the above heat resistance, transparency, spectral performance, and refractive-index change.

SUMMARY OF THE INVENTION

The present invention is achieved to solve the conventional problems and its object is to provide a solid-state imaging device having a high condensing efficiency even for a structure using a sealing resin.

The $1^{st}$ invention of the present invention (corresponding to claim 1) is a solid-state imaging device comprising:
 a light-receiving portion for receiving light;
 a microlens formed on said light-receiving portion and having a predetermined first refractive index;
 a thin-film lens formed on the microlens; and
 a resin portion formed on the thin-film lens and having a predetermined second refractive index,
 wherein the refractive index of the thin-film lens is smaller than the first and second refractive indexes, and the,thin-film lens is made of an inorganic material.

The $2^{nd}$ invention of the present invention (corresponding to claim 2)is a solid-state imaging device comprising:
 a light-receiving portion for receiving light;
 a microlens formed on the light-receiving portion and having a predetermined first refractive index;
 a thin-film lens formed on the microlens; and
 a resin portion formed on the thin-film lens and having a predetermined second refractive index,
 wherein the refractive index of the thin-film lens is smaller than the first and second refractive indexes, and the thin-film lens is a flat member made of resin curved along a curved face of the microlens.

The $3^{rd}$ invention of the present invention (corresponding to claim 3) is the solid-state imaging device according to $1^{st}$ or $2^{nd}$ inventions, wherein the first and second refractive indexes are substantially equal to each other.

The $4^{th}$ invention of the present invention (corresponding to claim 4) is the solid-state imaging device according to $1^{st}$ invention, wherein
 the thin-film lens is a lens made of fluoride and/or oxide.

The $5^{th}$ invention of the present invention (corresponding to claim 5) is the solid-state imaging device according to 1st or 2nd inventions, wherein the microlens is a lens made of resin.

The $6^{th}$ invention of the present invention (corresponding to claim 6) is the solid-state imaging device according to 5th invention, wherein
 the first and second refractive indexes are close to 1.56 and the refractive index of the thin-film lens ranges between 1.36 or more and 1.50 or less.

The $7^{th}$ invention of the present invention (corresponding to claim 7 to 11) is the solid-state imaging device according to any one of 2nd to $6^{th}$ inventions, wherein the thin-film lens is made of resin, the microlens has a diameter of approx. 4000 nm, and the thin-film lens has a thickness of 80 nm or more to 1000 nm or less.

BRIEF DESCRIPTION OF THE DRAWINGS

FIG. 3 is a partial sectional view of a conventional solid-state imaging device for explaining a microlens or the like.

Figure 1:
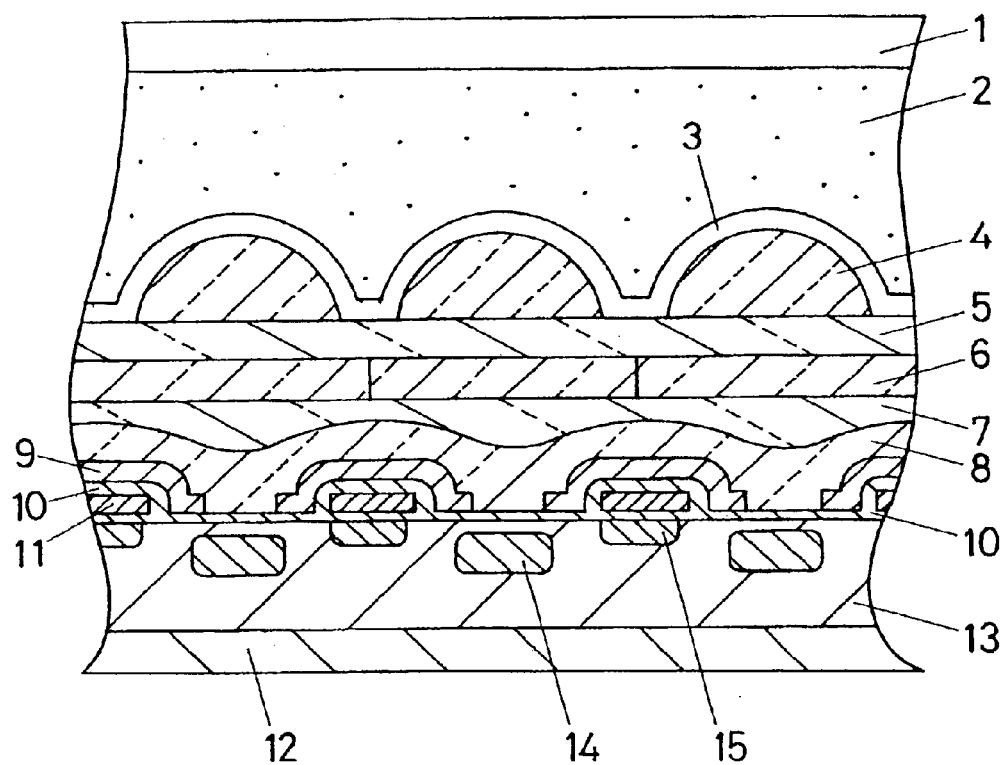
FIG. 1 is a sectional view of a solid-state imaging device of an embodiment of the present invention.

DESCRIPTION OF SYMBOLS 1, 31 . . . Cover glass
2, 32 . . . Sealing resin
3 . . . Thin-film lens
4, 34 . . . Microlens
5, 35 . . . Second flattening layer
6, 36 . . . Color-filter layer
7, 37 . . . First flattening layer
8, 38 . . . Insulating film
9 . . . Opaque film
10 . . . Insulating film
11 . . . Polycrystal-silicon electrode
12, 42 . . . n-type semiconductor substrate
13, 43 . . . p-type well layer
14, 44 . . . Photodiode
15 . . . Vertical transfer register

DETAILED DESCRIPTION OF THE PREFERRED EMBODIMENTS

An embodiment of the present invention will be described below by referring to the accompanying drawings.

Figure 2:
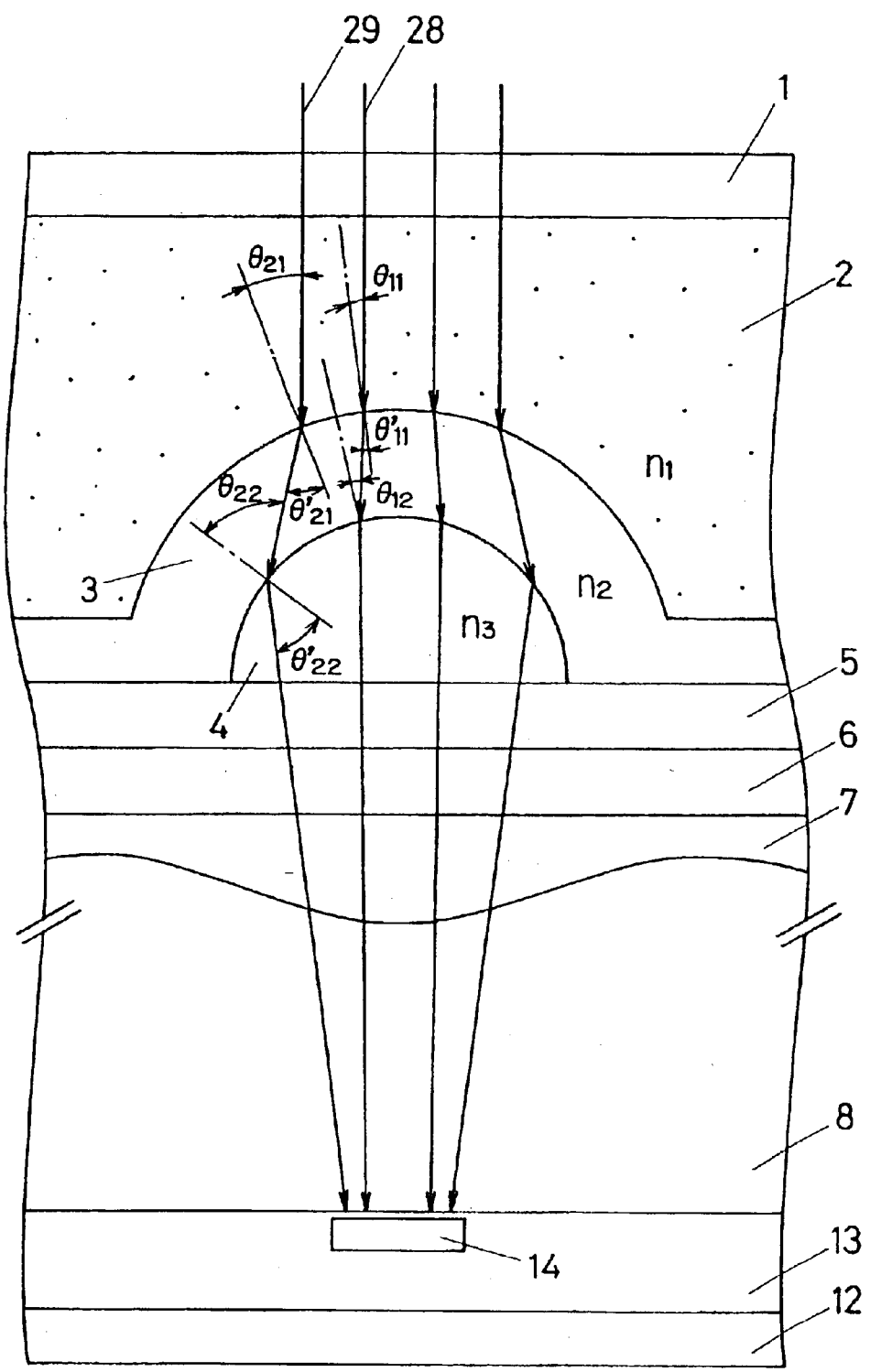
FIG. 2 is a partial sectional view of the solid-state imaging device of the embodiment of the present invention for explaining improvement of a condensing efficiency.

FIG. 1 is a sectional view of a solid-state imaging device of an embodiment of the present invention and FIG. 2 is a partial sectional view of the solid-state imaging device in FIG. 1 showing a state in which light comes into a microlens and is condensed on a photodiode.

As shown in FIG. 1, a p-type well layer 13 is formed on the surface layer of an n-type semiconductor substrate 12 and a photodiode 14 serving as a light-receiving portion for detecting an intensity of light is formed in the p-type well layer 13 every predetermined interval.

Moreover, a vertical transfer register 15 is formed nearby the surface layer in the p-type well layer 13 and an insulating film 10 is formed on the surface layer of the p-type well layer 13. A polycrystal-silicon electrode 11 is formed on the insulating film 10 and moreover, an insulating film 10 covering the polycrystal-silicon electrode 11 is formed.

An opaque film 9 is formed so as to cover the polycrystal-silicon electrode 11 and avoid the upper portion of the photodiode 14. An insulating film 8 is formed so as to cover the opaque film 9 and a first flattening layer 7 for flattening a surface layer is formed on the insulating film 8.

Moreover, a color-filter layer 6 and a second flattening layer 5 are formed on the first flattening layer 7. Furthermore, a microlens 4 is formed on the second flattening layer 5 so as to correspond to each photodiode 14. A thin-film lens 3 is formed on the microlens 4, cover glass 1 is provided above the thin-film lens 3, and a sealing resin 2 is injected between the thin-film lens 3 and the cover glass 1.

As described above, FIG. 2 is an illustration showing a part of the solid-state imaging device in FIG. 1 including main components. The solid-state imaging device of an embodiment of the present invention will be described below by referring to FIG. 2.

In FIG. 2, a ray 28 incoming from the vicinity of the center of the microlens 4 passes through the cover glass 1 and comes into the thin-film lens 3 with an incoming angle $\theta_{11}$ through the sealing resin 2. The incoming angle $\theta_{11}$ is comparatively small because the ray 28 incomes to the vicinity of the central portion of the thin-film lens 3. Therefore, the ray 28 incoming to the thin-film lens 3 is only slightly refracted.

At the time of assuming a refractive index of the sealing resin 2 as n1, a refractive index of the thin-film lens 3 as n2, the incoming angle $\theta_{11}$ and outgoing angle $\theta'_{11}$ are related each other in accordance with the Snell's expression of the following (Equation 1).

$$n1 \cdot \text{Sin}(\theta_{11}) = n2 \cdot \text{Sin}(\theta'_{11}) \qquad \text{[Equation 1]}$$

For example, at the time of setting a refractive index n1 of the sealing resin 2 to 1.56, a refractive index n2 of the thin-film lens 3 to 1.38, and $\theta_{11}$ to 1°, $\theta'_{11}$ becomes equal to 1.1° and the ray 28 is only slightly refracted.

Because the ray 28 refracted by the thin-film lens 3 comes into the vicinity of the central portion of the microlens 4, an incoming angle $\theta_{12}$ of the ray 28 to the microlens 4 is comparatively small. Therefore, the ray 28 reaching the microlens 4 is hardly refracted but it linearly advances and reaches the photodiode 14.

However, a ray 29 incoming to the circumference of the microlens 4 passes through the cover glass 1 and then, comes into the thin-film lens 3 through the sealing resin 2. Because the ray 29 comes into the circumferential portion of the thin-film lens 3, an incoming angle $\theta_{21}$ of the ray 29 becomes larger than $\theta_{11}$.

As described above, at the time of assuming the refractive index of the sealing resin 2 as n1 and the refractive index of the thin-film lens 3 as n2, the following (Equation 2) is effectuated between the incoming angle $\theta_{21}$ and an outgoing angle $\theta'_{21}$.

$$n1 \cdot \text{Sin}(\theta_{21}) = n2 \cdot \text{Sin}(\theta'_{21}) \qquad \text{[Equation 2]}$$

At the time of setting the refractive index n1 of the sealing resin 2 to 1.56 and the refractive index n2 of the thin-film lens 3 to 1.38, $\theta'_{21}$ becomes larger than $\theta_{21}$.

For example, when $\theta_{21}$ is equal to 43°, $\theta'_{21}$ becomes equal to 50.4° and thereby, a large outgoing-angle change occurs compared to a case in which the ray 29 comes in from the central portion of the lens 4. That is, the ray 29 is greatly refracted in the circumferential direction as compared with the case of the central portion.

The refracted ray 29 comes into the microlens 4 at an incoming angle of $\theta_{22}$.

The position for the ray 29 to come into the microlens 4 is a considerably-outside position of the microlens 4 and the incoming angle $\theta_{22}$ becomes very large. It is found that the incoming angle $\theta_{22}$ increases compared to the case in which it is assumed that the ray 29 linearly advances without being refracted by the thin-film lens 3 and comes into the microlens 4.

At the time of assuming an incoming angle of the ray 29 incoming to the microlens 4 as $\theta_{22}$, an outgoing angle of the ray 29 from the microlens 4 as $\theta'_{22}$, a refractive index of the thin-film lens 3 as n2, and a refractive index of the microlens 4 as n3, the following (Equation 3) is effectuated.

$$n2 \cdot \text{Sin}(\theta_{22}) = n3 \cdot \text{Sin}(\theta'_{22}) \qquad \text{[Equation 3]}$$

At the time of making the refractive index n3 of the microlens 4 equal to 1.56 of the refractive index n1 of the sealing resin 2, $\theta'_{22}$ becomes equal to 58.7° when $\theta_{22}$ is equal to 75°.

The angle 58.7° represents that the ray 29 tilts by approx. 9° inward at the time of comparing the angle with an angle for the ray 29 to pass through the sealing resin 2. That is, the ray 29 incoming to the microlens 4 is greatly refracted and advances toward the photodiode 14, passes through the insulating film 8 and the like, and then reaches the photodiode 14.

Thus, by setting the thin-film lens 3 onto the microlens 4, the light incoming to the circumferential portion of the thin-film lens 3 is also focussed to the photodiode 14 in accordance with a large refraction effect. Therefore, more light comes into the photodiode 14.

Figure 3:
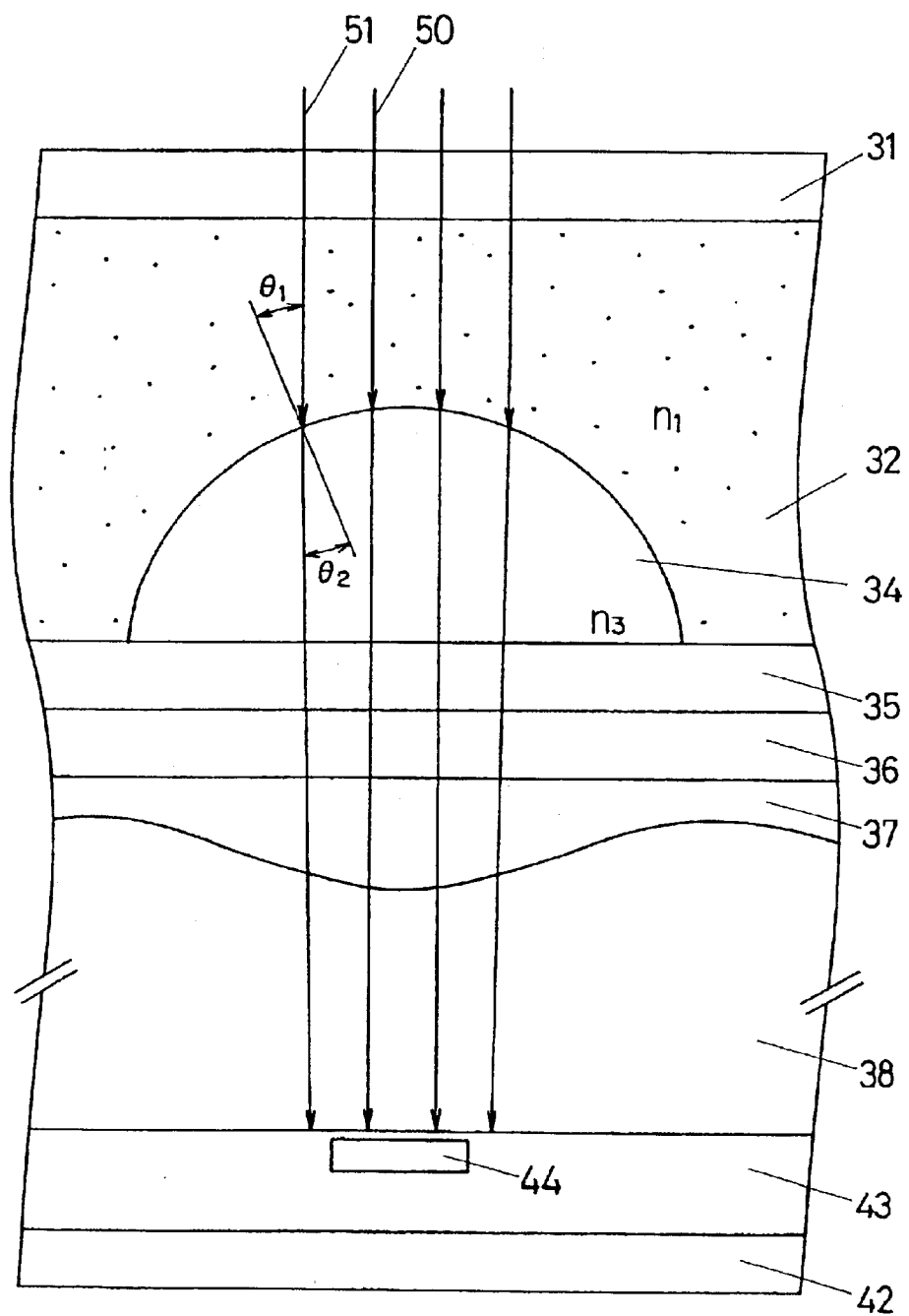

The above effect does no appear in a conventional structure shown in FIG. 3 in which no thin-film lens is present on a microlens 34 but a sealing resin 32 directly contacts with the microlens 34.

That is, a ray 50 incoming to the vicinity of the central portion of the microlens 34 comes into a photodiode 44 but a ray 51 incoming to the circumference of the microlens 34 does not come into the photodiode 44. This is because heat resistance, transparency, spectral performance, and refractive-index change are considered and thereby, the difference between the refractive index n1 of the sealing resin 32 and the refractive index n3 of the microlens 34 is inevitably decreased, and $\theta_2$ becomes only slightly smaller than $\theta_1$.

Moreover, an extreme case with no refraction effect under the same condition as the case described in accordance with FIG. 2 will be described below that the refractive index n1 of the sealing resin 32 is equal to the refractive index n3 of the microlens 34.

In FIG. 3, the following (Equation 4) is effectuated between the refractive index n1 of the sealing resin 32, refractive index n3 of the microlens 34, incoming angle $\theta_1$, and outgoing angle $\theta_2$ in accordance with Snell's relational expression.

$$n1 \cdot \mathrm{Sin}(\theta_1) = n3 \cdot \mathrm{Sin}(\theta_2) \qquad \text{[Equation 4]}$$

In this case, because n1 is equal to n3, $\theta_1$ becomes equal to $\theta_2$. This represents that the light incoming to the microlens 34 is not refracted at all. That is, this represents that every ray incoming to the microlens 34 linearly advances and there is no condensing effect at all. Therefore, the ray 51 incoming to the circumference of the microlens 34 is not condensed by the photodiode 44.

However, as for the embodiment of the present invention described by referring to FIG. 2, even if the refractive index of the sealing resin 2 is equal to that of the microlens 4, the light incoming to the circumference of the thin-film lens 3 is focussed by the photodiode 14 because the light shows a very large refraction effect. This is exactly the effect of the thin-film lens 3.

Therefore, it is very useful to use the thin-film lens 3. Moreover, because it is possible to greatly refract the light incoming to the circumference of the thin-film lens 3 as compared with the case in FIG. 3 in which no thin-film lens is used and make more light come into the photodiode 14, the sensitivity is substantially improved.

A material of the insulating film 8 shown in FIG. 2 uses, for example, silicon oxide. Moreover, a material of the microlens 4 uses a phenol-, acrylic- or styrene-based resin. The sealing resin 2 uses, for example, an acrylic-based resin.

It is possible to preferably use either of fluoride such as magnesium fluoride or aluminum fluoride and oxide such as silicon oxide as a material of the thin-film lens 3. These materials are preferable as a material of the thin-film lens 3 at the time of considering a refractive index of a synthetic resin (phenol-based resin, styrene-based resin, or acrylic-based resin) having a low refractive index and frequently used as a material of the microlens 4.

Moreover, by using an in organic material for the thin-film lens 3, the lens 3 becomes superior in heat resistance.

It is preferable that the refractive index n2 of the thin-film lens 3 is smaller than the refractive index n3 of the microlens 4 and the refractive index n1 of the sealing resin 2. For example, when the refractive index n3 of the microlens 4 and the refractive index n1 of the sealing resin 2 are both equal to approx. 1.56, it is preferable to set the refractive index n2 of the thin-film lens 3 to a value between 1.36 and 1.50 (both included).

The above value of approx. 1.56 represents a range between more than 1.50 and 1.60 or less. Moreover, to improve the above refraction effect, it is preferable to use the thin-film lens 3 having a refractive index as smaller than the refractive index n3 of the microlens 4 and the refractive index n1 of the sealing resin 2 as possible. On the other hand, at the time of using an inorganic material such as the above-described fluoride or oxide, it is possible to form the thin-film lens 3 having a refractive index ranging between 1.36 and 1.50 (both included) even if an impurity is contained. By using the thin-film lens 3 having the refractive index, it is possible to generate the above refraction effect.

Moreover, the thin-film lens 3 is not restricted to a single-layer film. For example, it is also permitted to use a double-layer film made of fluoride and oxide. Furthermore, it is permitted to superimpose a medium-high-refractive-index layer made of titanium oxide, tantalum oxide, niobium oxide, zirconium oxide, indium oxide, and aluminum oxide on the above low-refractive-index layer made of fluoride.

It is preferable to set a film thickness of the thin-film lens 3 to a value between 80 and 1000 nm (both included). The lower limit is set to 80 nm because the refraction effect is deteriorated almost substantially to zero if the thickness of the thin-film lens 3 is decreased to a value smaller than 80 nm. The upper limit is set to 1000 nm because it is considered to use a conventional microlens having a diameter of 4 to 5 $\mu$m (4000 to 5000 nm) for a solid-state imaging device of the present invention.

In case of setting a film thickness of the thin-film lens 3 to approx. 500 nm, it is confirmed that the refraction effect greatly appears. The fact that the microlens of claim 6 has a diameter of approx. 4000 nm represents a range between 3000 and 5000 nm.

Moreover, when the thin-film lens 3 is made of resin, it is preferable to set the film thickness to a value between 80 and 1000 nm (both included) so that the thin-film lens 3 can withstand a bad condition such as high temperature and high humidity.

A specific method for forming the thin-film lens 3 can use any method having been used so far as long as the method can stably form a material configuring a layer on the microlens 4. For example, it is possible to preferably use the sputtering method such as the magnetron sputtering method, high-frequency sputtering method, ECR sputtering method, or ion-beam sputtering method, the deposition method such as the resistive heating deposition method, high-frequency heating deposition method, or electron-beam deposition method, the CVD method such as the plasma CVD method and optical CVD method, or the spin coating method.

Meanwhile even if the thin-film lens 3 made of fluoride and/or oxide having a refractive index smaller than the refractive index n3 of the microlens 4 and the refractive index n1 of the sealing resin 2 is set between the sealing resin 2 and the microlens 4, heat resistance, transparency, spectrum performance, or refractive index change is not deteriorated. This is because the thin-film lens 3 is made of an inorganic material.

Lastly, as for this embodiment, it is described that the refractive index n1 of the sealing resin 2 is equal to the refractive index n3 of the microlens 4. However, it is also permitted that the refractive index n3 of the microlens 4 is slightly larger than the refractive index n1 of the sealing resin 2. That is, it is permitted that the both indexes n3 and n1 are substantially the same.

Moreover, even if the refractive index n1 of the sealing resin 2 is larger than the refractive index n3 of the microlens 4 exceeding the range of substantially the same or the refractive index n3 of the microlens 4 is larger than the refractive index n1 of the sealing resin 2 exceeding the range of substantially the same, the above condensing effect appears when the refractive index n2 of the thin-film lens 3 is smaller than n1 and n3.

Embodiments

Hereafter, the present invention will be more minutely described in accordance with embodiments. However, the present invention is not restricted to the following embodiments.

First, as shown in FIG. 1, the photodiode 14 serving as a light-receiving portion which is an n-type impurity area is formed in the p-type well layer 13 formed on the surface layer of the n-type semiconductor substrate 12 together with the vertical transfer register 15 and the like through the ion implantation method.

Then, a silicon-oxide film is formed through the thermal oxidation method, moreover a silicon-nitride film is formed on the silicon-oxide film through the chemical vapor deposition method (CVD method) to use the silicon-nitride film as the insulating film 10. Then, a polycrystal-silicon film is formed on the silicon-nitride film (insulating film 10) through the CVD method.

The upper portion of the photodiode 14 of the polycrystal-silicon film is removed through etching and further thermally oxidized. As a result, a patterned polycrystal-silicon electrode 11 (gate electrode) and a silicon-oxide film serving as the insulating film 10 covering the electrode 11 are obtained.

Then, the opaque film 9 is formed so as to cover the polycrystal silicon electrode 11 and avoid the upper portion of the photodiode 14. The opaque film 9 uses an aluminum film formed through the sputtering method.

The insulating film 8 is formed on the opaque film 9. The insulating film 8 uses BPSG (boron-phosphorus-silicate glass) film formed through the CVD method.

Moreover, the first flattening layer 7 is formed. It is preferable to use a material having a refractive index higher than that of the insulating film 8 (for example, phenol-based resin, styrene-based resin, or acrylic-based resin) for the first flattening layer 7. In this case, however, the first flattening layer 7 is formed through the spin coating method by using acrylic resin. The first flattening layer 7 functions as an in-layer microlens. The in-layer microlens has an action for improving the condensing effect to the photodiode 14 together with an on-chip microlens to be described later.

The color-filter layer 6 is formed on the first flattening layer 7. The color-filter layer 6 is formed through the spin coating method by using negative-type photosensitive acrylic-based resin as a layer to be dyed. The color-filter layer 6 is formed by repeating the steps of exposing, developing, and patterning the layer 6 so that a predetermined portion to be dyed is left, and dyeing a left material portion for primary colors R, G, and B.

However, it is also permitted to form the color-filter layer 6 by using complementary colors or by dispersing pigments or dyes in color-filter resin.

The second flattening layer 5 is formed on the color-filter layer 6. The flattening layer 5 flattens very-small unevenness on the color-filter layer 6. The second flattening layer 5 is formed by applying acrylic resin through the spin coating method.

The (on-chip) microlens 4 uses a photosensitive resin obtained by adding naphthoquinone diazide to a polyparavinylphenol-based resin. It is possible to use the photosensitive resin as a positive-type resist.

Moreover, by heat-treating the resin, the resin is liquefied due to thermal plasticity and the shape of the resin is deformed into a hemisphere and then, the shape is fixed and solidified due to the thermosetting property, and a solidified lens shape is realized.

Furthermore, it is possible to improve the visible-light transmittance to 90% or more by irradiation with ultraviolet radiation in the step immediately after development and deform the resin into a lens shape under the transparent state.

A resin layer made of the photosensitive resin is divided into parts by using an i-line stepper, dived parts are decolorized through irradiation with ultraviolet rays, and heated and softened to form a dome-shaped lens.

Moreover, the thin-film lens 3 is formed on the microlens 4. The thin-film lens 3 uses magnesium fluoride and is formed through the electron-beam deposition method.

The thin-film lens 3 on the surface of the microlens 4 thus formed has a thickness of 0.4 micron.

The sealing resin 2 is applied onto the thin-film lens 3 and the cover glass 1 is set on the resin 2. The sealing resin 2 uses an acrylic-based resin.

As a result of measuring the difference between sensitivities of a solid-state imaging device at the time of using a thin-film lens and using no thin-film lens, it is confirmed that the sensitivity of the solid-state imaging device is improved by 30% by forming the thin-film lens 3.

Also through optical calculations in accordance with refractive index, film thickness, and microlens shape, it is confirmed that the sensitivity is improved by approx. 30% by forming a magnesium-fluoride film.

Moreover, as a result of testing various performances of the solid-state imaging device configured as described above, performances almost same as conventional ones can be confirmed.

For the above embodiment, a CCD solid-state imaging device having an in-layer lens and a color filter is described. However, using a thin-film lens that is a feature of the present invention is not restricted to the above embodiment. It is possible to use a thin-film lens for various types of solid-state imaging devices. For example, it is possible to use a thin-film lens for a MOS-type solid-state imaging device.

Figure 4:
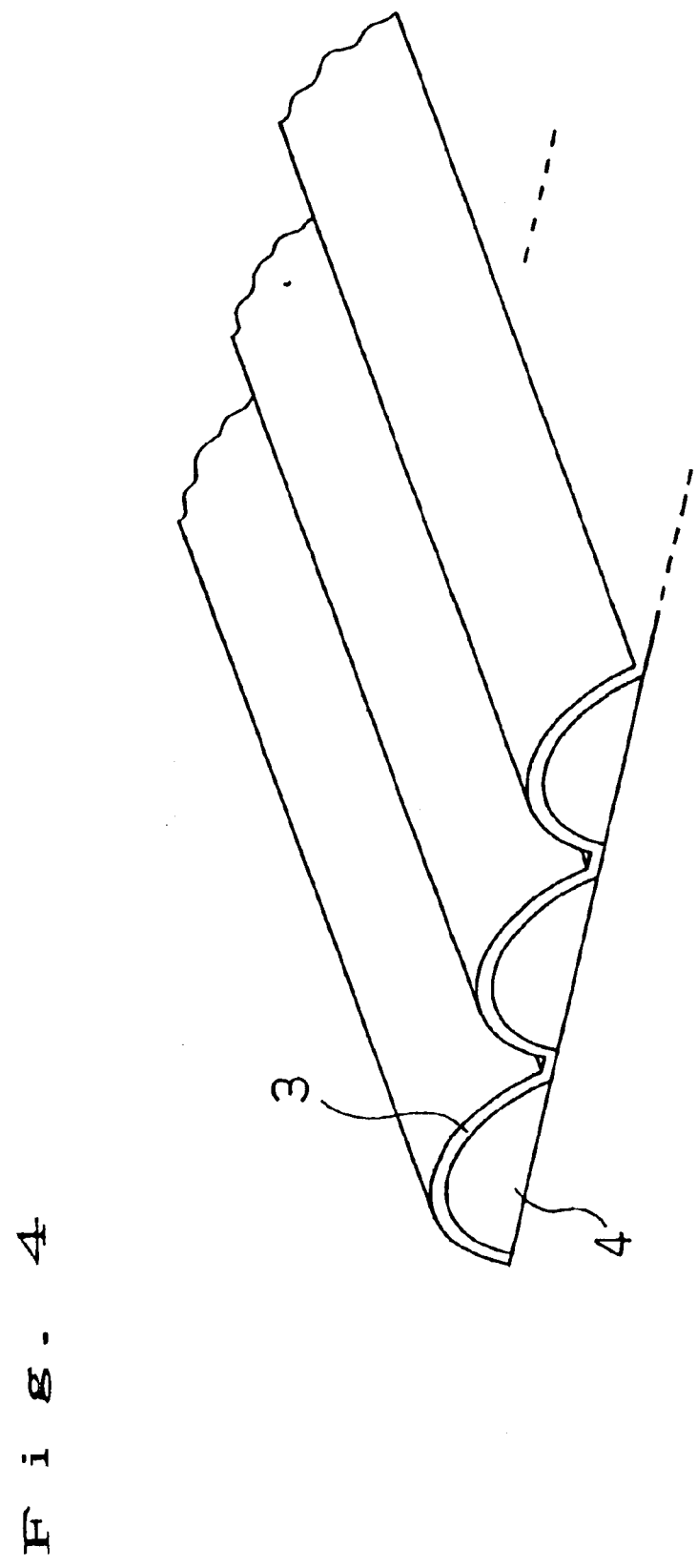
FIG. 4 is a perspective view showing a semicylindrical microlens.

Moreover, when the microlens 4 has a hemispherical shape, the thin-film lens 3 uses a domic tabular member. When the microlens 4 has a semicylindrical shape shown in FIG. 4, the thin-film lens 3 uses a semicylindrical tabular member corresponding to the curved shape of the microlens 4. In short, it is preferable that the thin-film lens 3 of the present invention uses a tabular member curved correspondingly to the curved surface of the microlens.

As described above, the present invention makes it possible to provide a solid-state imaging device having a high condensing efficiency even for a structure using a sealing resin.

What is claimed is:

1. A solid-state imaging device comprising:

a light-receiving portion for receiving light;

a microlens formed on said light-receiving portion and having a predetermined first refractive index;

a thin-film lens formed on the microlens; and a resin portion formed on the thin-film lens and having a predetermined second refractive index, wherein the refractive index of the thin-film lens is smaller than the first and second refractive indexes.

2. The solid-state imaging device according to claim 1, wherein the microlens has a curved face, and the thin-film lens is a member curved along the curved face of the microlens.

3. The solid-state imaging device according to claim 1, wherein the first and second refractive indexes are substantially equal to each other.

4. The solid-state imaging device according to claim 1, wherein the microlens is a lens made of resin.

5. The solid-state imaging device according to claim 4, wherein the first and second refractive indexes are close to 1.56 and the refractive index of the thin-film lens ranges between 1.36 or more and 1.50 or less.

6. The solid-state imaging device according to claim 1, wherein the thin-film lens is made of resin.

7. The solid-state imaging device according to claim 6, wherein the microlens has a diameter of approx. 4000 nm, and the thin-film lens has a thickness of 80 nm or more to 1000 nm or less.

8. The solid-state imaging device according to claim 1, wherein the microlens has a diameter of approx. 4000 nm, and the thin-film lens has a thickness of 80 nm or more to 1000 nm or less.

9. The solid-state imaging device according to claim 1, wherein the thin-film lens is made of inorganic material.

10. The solid-state imaging device according to claim 9, wherein the thin-film lens is a lens made of fluoride and/or oxide.

11. The solid-state imaging device according to claim 1, wherein the microlens has a central portion, and light incident on the thin film lens from the resin portion is refracted to outside the microlens central portion due to the difference in refractive index between the resin portion and the thin-film lens, and the light refracted to outside the microlens central portion is made to condense on the light receiving portion due to the difference in refractive index between the thin-film lens and the microlens.

* * * * *

UNITED STATES PATENT AND TRADEMARK OFFICE
CERTIFICATE OF CORRECTION

PATENT NO. : 6,831,311 B2
DATED : December 14, 2004
INVENTOR(S) : Shinji Uchida

It is certified that error appears in the above-identified patent and that said Letters Patent is hereby corrected as shown below:

Title page,
Item [56], References Cited, FOREIGN PATENT DOCUMENTS, please change "JP4-223371 * 12/1990" to -- JP4-223371 * 12/1992 --; please delete the following:
"JP 4-275459    4/1992"; and
"JP 4-223371    8/1992".

Signed and Sealed this

Thirteenth Day of September, 2005

JON W. DUDAS
*Director of the United States Patent and Trademark Office*